(12) United States Patent
Miyake et al.

(10) Patent No.: US 8,530,539 B2
(45) Date of Patent: Sep. 10, 2013

(54) CURABLE RESIN COMPOSITION FOR NANOIMPRINT

(75) Inventors: Hiroto Miyake, Himeji (JP); Shuso Iyoshi, Himeji (JP)

(73) Assignee: Daicel Chemical Industries, Ltd., Osaka-shi (JP)

(*) Notice: Subject to any disclaimer, the term of this patent is extended or adjusted under 35 U.S.C. 154(b) by 5 days.

(21) Appl. No.: 12/866,398

(22) PCT Filed: Jan. 8, 2009

(86) PCT No.: PCT/JP2009/000039
§ 371 (c)(1),
(2), (4) Date: Apr. 15, 2011

(87) PCT Pub. No.: WO2009/101758
PCT Pub. Date: Aug. 20, 2009

(65) Prior Publication Data
US 2012/0141738 A1    Jun. 7, 2012

(30) Foreign Application Priority Data

Feb. 14, 2008    (JP) ................................. 2008-033455

(51) Int. Cl.
*C08F 2/46* (2006.01)
*C08J 3/28* (2006.01)

(52) U.S. Cl.
USPC ............... 522/168; 522/71; 522/74; 522/113; 522/120; 522/131; 522/150; 522/153; 522/170; 264/299; 264/300

(58) Field of Classification Search
USPC ............ 522/71, 74, 113, 120, 130, 150, 153, 522/170, 168; 264/299, 300
See application file for complete search history.

(56) References Cited

U.S. PATENT DOCUMENTS

| | | | |
|---|---|---|---|
| 5,772,905 A | 6/1998 | Chou | |
| 5,817,242 A | 10/1998 | Biebuyck et al. | |
| 5,900,106 A | 5/1999 | Takahashi et al. | |
| 5,925,259 A | 7/1999 | Biebuyck et al. | |
| 7,648,767 B2 * | 1/2010 | Fu et al. | 428/429 |
| 8,288,079 B2 * | 10/2012 | Ogino et al. | 430/281.1 |
| 2007/0160937 A1 * | 7/2007 | Ogino et al. | 430/311 |
| 2007/0196589 A1 | 8/2007 | Fu et al. | |
| 2007/0298176 A1 | 12/2007 | DiPietro et al. | |
| 2008/0167396 A1 | 7/2008 | Murao | |

FOREIGN PATENT DOCUMENTS

| | | |
|---|---|---|
| EP | 1 873 174 A1 | 1/2008 |
| JP | 2006-137021 A | 6/2006 |
| JP | 2007-1250 A | 1/2007 |
| JP | 2007-231205 A | 9/2007 |
| JP | 2007-320072 A | 12/2007 |
| JP | 2008-19292 A | 1/2008 |
| JP | 2008-95037 A | 4/2008 |
| JP | 2008-238417 A | 10/2008 |
| JP | 2008-266608 A | 11/2008 |
| WO | WO 2006/083284 A2 | 8/2006 |
| WO | WO 2008/079934 A2 | 7/2008 |

OTHER PUBLICATIONS

Hans R. Kricheldorf, Oskar Nuyken, and Graham Swift, Editors. Poly(vinyl ether)s, Poly(vinyl ester)s, and Poly(vinyl halogenide)s. Handbook of Polymer Synthesis. Second Edition. CRC Press 2004.*
Extended European Search Report dated May 7, 2012, issued in counterpart European patent application No. 09711120.7.

* cited by examiner

*Primary Examiner* — Sanza McClendon
(74) *Attorney, Agent, or Firm* — Birch, Stewart, Kolasch & Birch, LLP

(57) ABSTRACT

Disclosed is a photocurable resin composition for nanoimprint, containing a curable monomer component with or without a binder resin. The composition further contains 0.001 to 5 parts by weight of a compound having a reactive functional group and a hydrophobic functional group in the same molecular skeleton, per 100 parts by weight of the total amount of the curable monomer component and binder resin. Preferably, the reactive functional group is at least one functional group selected from the group consisting of hydroxyl groups, epoxy groups, vinyl ether groups, oxetanyl groups, alkoxysilane groups, and free-radically polymerizable vinyl groups, and the hydrophobic functional group is at least one functional group selected from the group consisting of fluorine-containing groups, alkylsilane groups, alicyclic hydrocarbon groups, and aliphatic hydrocarbon groups having 4 or more carbon atoms.

9 Claims, No Drawings

CURABLE RESIN COMPOSITION FOR NANOIMPRINT

TECHNICAL FIELD

The present invention relates to a photocurable resin composition for nanoimprint and a cured article obtained therefrom, which photocurable resin composition is suitable for the highly accurate formation of a fine pattern through nanoimprinting in the field of microlithography. The present invention also relates to a process for the production of a fine structure using the photocurable resin composition, and to a fine structure produced by the process.

BACKGROUND ART

The miniaturization of electronic components, for which a resolution down to the range of less than 1 μm is required, has been achieved substantially by photolithographic techniques. To give further smaller structures, miniaturization is being achieved by the progress of ArF lithography and ArF immersion lithography technologies. However, the size of such a small structure of about 32 nm or less approximates to the size of a resin used, and this causes problems such as line edge roughness to come to the surface. On the other hand, the increasingly high requirements with respect to resolution, wall slope, and aspect ratio (ratio of height to resolution) result in a cost explosion in the case of the apparatuses required for photolithographic structuring, such as masks, mask aligners, and steppers. In particular, owing to their price of several billion yen, modern steppers are a considerable cost factor in microchip production. Independently, there is an attempt to use short-wave radiation, such as electron beams and X-rays, for achieving higher resolution. However, this technique still has many problems from the viewpoint of productivity.

Nanoimprint techniques are expected as an alternative to these techniques. Among the nanoimprint techniques, those mainly known are a thermal nanoimprint technique, in which a thermoplastic resin is heated and softened, then a mold having a predetermined pattern is pressed thereagainst to form a pattern on the thermoplastic resin; and an ultraviolet nanoimprint technique (UV-nanoimprint technique), in which a photocurable compound is applied to a substrate, and, after the substrate and a mold are pressed against each other, the resin composition is cured in ultraviolet rays and becomes solid to give a pattern. Though both of them are excellent techniques, the UV-nanoimprint technique is expected to give a further higher throughput, because this technique employs light to cure the resin and thereby does not need a heating and cooling process in contrast to the thermal nanoimprint technique. In addition to this, the UV-nanoimprint technique has several key features as follows. Specifically, the UV-nanoimprint technique can easily and conveniently give a further higher registration, because it uses a transparent mold. In addition, the UV-nanoimprint technique uses a composition mainly containing liquid monomers in combination and can thereby form a pattern under a very low transfer pressure as compared to that in the thermal nanoimprint technique.

Patent Document 1 describes a nanoimprint process which is based on a thermoplastic deformation of a resist, applied to the whole surface of a substrate, by a relief present on a rigid stamp. Thermoplastics (poly(methyl methacrylate)s, PMMAs) are used as a resist for hot stamping. Owing to common thickness variations of about 100 nm over the total wafer surface, it is not possible to structure 6-, 8-, and 12-inch wafers in one step with a rigid stamp. Thus, a complicated "step and repeat" method would have to be used, which, however, is unsuitable owing to the reheating of already structured neighboring areas.

In Patent Documents 2, 3, and 4, a stamp is wet with a UV-curable resist (self-assembled monolayer, e.g. alkylsiloxane) and then pressed onto a smooth substrate. Analogously to a common stamp process, the structured resist material is formed when the stamp is raised from the substrate surface. The resist materials used exhibit sufficient wetting with respect to the substrate but are not suitable for a lift-off method, nor do they have sufficient etch resistance. The structure dimensions are in the region of 1 μm and are thus more than one order of magnitude too large.

Patent Document 5 reports another nanoimprint technique in which a fluorine-containing polymer is used to improve mold releasability (releasability from the mold). This technique, however, sacrifices adhesion to the substrate for the improvement in mold releasability and is thereby unsuitable for the formation of a satisfactory pattern, owing to the free-radical curing, non-solvent system employed as a reaction system. Especially when the nanoimprint technique is used as an alternate for photolithography, a smaller thickness of residual film is desired. However, when adopted to such use, the nanoimprint technique gives a film having insufficient adhesion to the substrate.

These processes and techniques are all unsuitable for achieving objects of the present invention as mentioned below.

Patent Document 1: U.S. Pat. No. 5,772,905
Patent Document 2: U.S. Pat. No. 5,900,160
Patent Document 3: U.S. Pat. No. 5,925,259
Patent Document 4: U.S. Pat. No. 5,817,242
Patent Document 5: Japanese Unexamined Patent Application Publication (JP-A) No. 2007-1250

DISCLOSURE OF INVENTION

Problems to be Solved by the Invention

Accordingly, an object of the present invention is to provide a photocurable resin composition for nanoimprint and a cured article therefrom, which photocurable resin composition is suitable for nanoimprinting and gives a cured article having satisfactory adhesion to a substrate and being satisfactorily releasable from a mold. The nanoimprinting enables more economical fine structuring (microstructuring) of electronic components with substantially lower line edge roughness than photolithography which gives both a high resolution and a satisfactory aspect ratio.

Another object of the present invention is to provide a process for the production of a fine structure using the photocurable resin composition for nanoimprint and to provide a fine structure produced by this process.

Means for Solving the Problems

After intensive investigations, the present inventors have found that accuracy in transfer can be improved by adding a specific compound to a resin composition for nanoimprint used as a transfer resist (nanoimprint resist), which specific compound helps the transfer resist to have remarkably improved mold releasability without significantly lowering adhesion to the substrate.

Specifically, the present invention provides, in an embodiment, a photocurable resin composition for nanoimprint, which contains a curable monomer component with or without a binder resin, wherein the photocurable resin composition further contains 0.001 to 5 parts by weight of a compound A per 100 parts by weight of the total amount of the curable monomer component and the binder resin, the compound A having both a reactive functional group and a hydrophobic functional group in the same molecular skeleton In the composition according to the present invention, the reactive functional group is preferably at least one functional group selected from the group consisting of hydroxyl groups, epoxy groups, vinyl ether groups, oxetanyl groups, alkoxysilane groups, and free-radically polymerizable vinyl groups. The hydrophobic functional group is preferably at least one functional group selected from the group consisting of fluorine-containing groups, alkylsilane groups, alicyclic hydrocarbon groups, and aliphatic hydrocarbon groups having 4 or more carbon atoms.

In a preferred embodiment of the present invention, the photocurable resin composition is a cationically curable composition containing a cationically curable monomer component and/or a free-radically curable composition containing a monomer having a free-radically polymerizable unsaturated bond, and the cationically curable monomer component is at least one compound selected from the group consisting of epoxy compounds, vinyl ether compounds, oxetane compounds, carbonate compounds, and dithiocarbonate compounds.

The photocurable resin composition according to the present invention is preferably a cationically curable composition, which cationically curable composition contains, as the compound A, a compound having a vinyl group as the reactive functional group and a fluorine-containing group as the hydrophobic functional group and contains, as the curable monomer component, at least one epoxy compound or oxetane compound.

Preferably, the photocurable resin composition according to the present invention contains an acrylic monomer as the curable monomer component.

The present invention includes a cured article cured from the photocurable resin composition.

The present invention further includes a process for the production of a fine structure, the process including the step of subjecting the photocurable resin composition to nanoimprinting to give a fine structure.

The process for the production of a fine structure according to the present invention preferably includes the steps of (1) forming a film from the photocurable resin composition on a support; (2) transferring a pattern to the film by means of a finely structured imprint stamp; (3) curing the patterned film; and (4) removing the imprint stamp to give an imprinted fine structure.

The present invention further includes a fine structure produced by the production process. Examples of the fine structure include semiconductor materials, flat screens, holograms, waveguides, structures for media, micromechanical components, and sensors.

As used herein the term "nanoimprint" means and includes not only a regular nanoimprint technique (narrowly-defined nanoimprint) in which a nanostamper is pressed against a film provided on a support to transfer a pattern to the film, but also a technique of transferring a fine pattern using a mold (broadly-defined nanoimprint) in which a resin composition is pored into a finely patterned mold used instead of the nanostamper, a support is laid thereon, and the resulting laminate is pressed from the uppermost surface thereof.

Advantages

The present invention adopts a cationic curing system and/or free-radical curing system to a resist for producing fine structures (e.g., semiconductor materials, flat screens, holograms, structures for media, micromechanical components, and sensors) in the field of microlithography and thereby dramatically improves mold releasability (releasability from the mold). Poor mold releasability remarkably impedes improvements of patterning accuracy. The present invention can thereby give fine structures with excellent pattern shapes but with less defects and, in particular, can stably perform patterning with a small thickness of residual film. The present invention provides curable resin compositions for nanoimprint and cured articles therefrom, which show excellent adhesion to the substrate and are satisfactorily releasable from the mold.

Best Modes for Carrying Out the Invention

A photocurable resin composition for nanoimprint according to the present invention is a photocurable resin composition for nanoimprint containing a curable monomer component with or without a binder resin. This photocurable resin composition further contains 0.001 to 5 parts by weight of a compound A having both a reactive functional group and a hydrophobic functional group in the same molecular skeleton, per 100 parts by weight of the total amount of the curable monomer component and the binder resin.

In the compound A, the hydrophobic functional group is effective for lowering adhesion to a mold when the coated film is removed from an adherend plate such as glass plate as the mold and is thereby effective for improving releasability from the adherend plate (mold). The reactive functional group is necessary for built-in of the compound A into the cured article derived from the curable monomer component and helps the cured article to have higher adhesion to the substrate such as glass plate.

As used herein the term "reactivity" (being reactive) means reactivity with respect to (a functional group of) the curable monomer component. Typically, when an epoxy-containing monomer is used as the curable monomer component, hydroxyl group is reactive with epoxy group of the curable monomer component. When an acrylic silane compound is used as the curable monomer component, an alkoxysilane group is reactive with silyl group of the curable monomer component.

For improving the mold releasability while maintaining satisfactory adhesion to the substrate, the compound to be added having a reactive functional group and a hydrophobic functional group in the same molecular skeleton should be segregated in the coated film and should therefore have poor immiscibility (compatibility) with the curable monomer component. For these purposes, the hydrophobic functional group is very important. Particularly when adopted to lithography use, this technique stably achieves patterning with a small thickness of residual film, which small thickness of residual film is significantly important in such lithography use.

The reactive functional group is necessary for the built-in of the compound A into the skeleton during photo-curing, and examples thereof include hydroxyl groups, epoxy groups, vinyl ether groups, oxetanyl groups, alkoxysilane groups, and free-radically polymerizable vinyl groups.

In the compound A having a reactive functional group and a hydrophobic functional group in the same molecular skeleton, preferred hydrophobic functional groups include fluorine-containing groups, alkylsilane groups, alicyclic hydrocarbon groups, and aliphatic hydrocarbon groups having 4 or more carbon atoms. The aliphatic hydrocarbon groups also include groups having a polymer chain composed of carbon-carbon bond (C—C bond).

Exemplary fluorine-containing groups include fluorine atom; fluoroalkyl groups having 1 to 20 carbon atoms; fluorovinyl groups; fluoroallyl groups; fluorocycloalkyl groups; fluorinated bridged alicyclic groups; fluoroaryl groups such as fluorophenyl group and fluoronaphthyl group; and fluoroaralkyl groups.

Exemplary fluoroalkyl groups having 1 to 20 carbon atoms include linear or branched-chain fluorinated alkyl groups corresponding to linear or branched-chain alkyl groups, except with at least one hydrogen atom being replaced by a fluorine atom. Representative examples of such fluorinated alkyl groups include fluorinated methyl groups such as trifluoromethyl group; fluorinated ethyl groups such as pentafluoroethyl and 2,2,2-trifluoroethyl groups; fluorinated propyl groups such as heptafluoropropyl, 2,2,3,3,3-pentafluoropropyl, and 2,2,3,3-tetrafluoropropyl groups; fluorinated isopropyl groups such as 2,2,2-trifluoro-1-(trifluoromethyl)ethyl group; fluorinated butyl groups such as nonafluorobutyl and 4,4,4-trifluorobutyl groups; fluorinated isobutyl groups; fluorinated s-butyl groups; fluorinated t-butyl groups; fluorinated pentyl groups such as undecafluoropentyl, 2,2,3,3,4,4,5,5,5-nonafluoropentyl, and 2,2,3,3,4,4,5,5-octafluoropentyl groups; fluorinated hexyl groups such as tridecafluorohexyl, 2,2,3,3,4,4,5,5,6,6,6-undecafluorohexyl, 2,2,3,3,4,4,5,5,6,6-decafluorohexyl, and 3,3,4,4,5,5,6,6,6-nonafluorohexyl groups; fluorinated heptyl groups such as pentadecafluoroheptyl, 2,2,3,3,4,4,5,5,6,6,7,7,7-tridecafluoroheptyl, and 2,2,3,3,4,4,5,5,6,6,7,7-dodecafluoroheptyl groups; fluorinated octyl groups such as heptadecafluorooctyl and 2,2,3,3,4,4,5,5,6,6,7,7,8,8,8-pentadecafluorooctyl groups; fluorinated nonyl groups such as nonadecafluorononyl and 2,2,3,3,4,4,5,5,6,6,7,7,8,8,9,9,9-heptadecafluorononyl groups; fluorinated decyl groups such as henicosafluorodecyl and 2,2,3,3,4,4,5,5,6,6,7,7,8,8,9,9,10,10,10-nonadecafluorodecyl groups; fluorinated dodecyl groups; fluorinated tetradecyl groups; fluorinated hexadecyl groups; and fluorinated octadecyl groups.

Exemplary fluorinated cycloalkyl groups include groups corresponding to cycloalkyl groups, except with at least one hydrogen atom being replaced by a fluorine atom (fluorocycloalkyl groups), including fluorinated cycloalkyl groups having 3 to 20 members, such as monofluorocyclopentyl groups, difluorocyclopentyl groups, nonafluorocyclopentyl group, monofluorocyclohexyl groups, difluorocyclohexyl groups, and undecafluorocyclohexyl group, of which fluorinated cycloalkyl groups having 5 to 20 members are preferred, and fluorinated cycloalkyl groups having 5 to 15 members are more preferred.

Exemplary fluorinated bridged alicyclic groups include fluorinated norbornyl groups, fluorinated adamantyl groups, fluorinated bornyl groups, fluorinated isobornyl groups, fluorinated tricyclo[5.2.1.0$^{2,6}$]decyl groups, fluorinated tetracyclo[4.4.0.1$^{2,50}$.1$^{7,10}$]dodecyl groups, and fluorinated decalinyl groups.

Exemplary alkylsilane groups include silyl groups each mono-, di-, or tri-substituted with a linear or branched-chain alkyl group having 1 to 6 carbon atoms, such as methyl, ethyl, propyl, isopropyl, butyl, isobutyl, s-butyl, t-butyl, pentyl, 1,1-dimethylpropyl, 2,2-dimethylpropyl, 3-methylbutyl, hexyl, 4-methylpentyl, 1,3-dimethylbutyl, 1-isopropylbutyl, 1,1-dimethylbutyl, 2-methylpentyl, 3,3-dimethylbutyl, 1,2,2-trimethylpropyl, or 2,2-dimethylbutyl group.

Exemplary alicyclic hydrocarbon groups include cycloalkyl groups such as cyclopentyl group, cyclohexyl group, and cyclooctyl group; cycloalkenyl groups; and bridged groups such as norbornyl group, adamantyl group, bornyl group, isobornyl group, tricyclo[5.2.1.0$^{2,6}$]decyl group, tetracyclo[4.4.0.1$^{2,5}$.1$^{7,10}$]dodecyl group, and decalinyl group.

Exemplary aliphatic hydrocarbon groups having 4 or more (e.g., about 4 to 30) carbon atoms include linear or branched-chain alkyl groups such as isopropyl group, butyl group, isobutyl group, s-butyl group, t-butyl group, pentyl group, hexyl group, heptyl group, octyl group, nonyl group, decyl group, dodecyl group, tetradecyl group, hexadecyl group, and octadecyl group; alkenyl groups such as vinyl and allyl groups; and alkynyl groups such as ethynyl group.

Concrete examples of the compound A having a reactive functional group and a hydrophobic functional group in the same molecular skeleton include the following compounds.

<Compounds Having Fluorine-Containing Group as Hydrophobic Functional Group>

(i) Examples of compounds having a hydroxyl group as the reactive functional group include fluorinated alcohols having 2 to 20 carbon atoms, such as 2,2,2-trifluoroethanol available from TOSOH F-TECH, INC.; hexafluoro-2-propanol available from Central Glass Co., Ltd.; 2,2,3,3-tetrafluoropropanol and 2,2,3,3,4,4,5,5-octafluoropentanol each available from Daikin Chemical Industries, Ltd.; 2-perfluoroalkylethanol available from Asahi Glass Co., Ltd.; and 2,2-bis(4-hydroxyphenyl)hexafluoropropane available from Central Glass Co., Ltd.

(ii) Examples of compounds having any of cationically reactive epoxy groups, vinyl ether groups, oxetanyl groups, and alkoxysilane groups as the reactive functional group include perfluoropropyl vinyl ether available from Asahi Glass Co., Ltd.; and FS Series available from Dow Corning Toray Co., Ltd. Independently, epoxy-containing compounds as derivatives of trifluoroacetic acid or trifluoroacetic anhydride are also usable herein.

(iii) Examples of compounds having any of free-radically polymerizable vinyl groups such as (meth)acrylic groups and vinyl groups as the reactive functional group include perfluoroalkylethyl acrylate (FA-108) available from Kyoeisha Chemical Co., Ltd.; and PolyFox PF Series available from Omnova Solutions, Inc.

<Compounds Having Alkylsilane Group as Hydrophobic Functional Group>

(i) Examples of compounds having a hydroxyl group as the reactive functional group include BY Series (hydroxyalkyl-terminated dimethylsiloxane) available from Dow Corning Toray Co., Ltd.

(ii) Examples of compounds having any of cationically reactive epoxy groups, vinyl ether groups, and oxetanyl groups as the reactive functional group usable herein include epoxy, vinyl ether, and oxetane compounds each having been treated with an alkylchlorosilane and having an active hydrogen group. Examples of such compounds include compounds corresponding typically to epoxidized tetrahydrobenzyl alcohol available from Daicel Chemical Industries, Ltd., 2-hydroxyethylvinyl ether (HEVE), diethylene glycol monovinyl ether (DEGV), 2-hydroxybutylvinyl ether (HBVE), and triethylene glycol divinyl ether each available from Maruzen Petrochemical Co., Ltd., and 3-ethyl-3-(methylol)oxetane available from Toagosei Co., Ltd., except for having been reacted with a trialkylchlorosilane.

(iii) Examples of usable compounds having any of free-radically polymerizable vinyl groups such as (meth)acrylic groups and vinyl groups as the reactive functional group include (meth)acrylates having been treated with an alkylchlorosilane and having an active hydrogen group, such as compounds corresponding typically to 2-hydroethyl(meth) acrylates and 4-hydrobutyl(meth)acrylates each available from Kyoeisha Chemical Co., Ltd., except for having been reacted with a trialkylchlorosilane.

<Compounds Having Alicyclic Hydrocarbon as Hydrophobic Functional Group>

(i) Examples of compounds having a hydroxyl group as the reactive functional group include hydrogenated bisphenol compounds. Examples thereof further include so-called cardo resins such as adamantanes having a hydroxyl group.

(ii) Examples of compounds having any of cationically reactive epoxy groups, vinyl ether groups, and oxetanyl groups as the reactive functional group include hydrogenated bisphenol-A glycidyl ethers.

(iii) Examples of compounds having any of free-radically polymerizable vinyl groups such as (meth)acrylic groups and vinyl groups as the reactive functional group include adamantyl (meth)acrylates available from Daicel Chemical Industries, Ltd.; isobornyl (meth)acrylates available from Daicel-Cytec Co., Ltd.; and dicyclopentyl (meth)acrylates available from Hitachi Chemical Co., Ltd.

<Compounds Having Aliphatic Hydrocarbon Group Having 4 or More Carbon Atoms as Hydrophobic Functional Group>

(i) Examples of compounds having a hydroxyl group as the reactive functional group include alcohols having 4 to 20 carbon atoms; Surfynol (polyether compound of acetylenic alcohol) available from Nisshin Chemical Industry Co., Ltd.; and hydroxy-terminated 4-methyl-1-pentene/α-olefin copolymers as TPX Series available from Mitsui Chemicals Inc.

(ii) Examples of compounds having any of cationically reactive epoxy groups, vinyl ether groups, and oxetanyl groups as the reactive functional group include monoepoxides having a long-chain alkyl group, as AOE Series available from Daicel Chemical Industries, Ltd.

(iii) Examples of compounds having any of free-radically polymerizable vinyl groups such as (meth)acrylic groups and vinyl groups as the reactive functional group include (meth) acrylates having a long-chain alkyl group.

The amount of the compound(s) A having a reactive functional group and a hydrophobic functional group in the same molecular skeleton is 0.001 to 5 parts by weight, preferably 0.01 to 2 parts by weight, and more preferably 0.1 to 2 parts by weight, per 100 parts by weight of the total amount of the curable monomer component and binder resin. The compound A, if in an amount of less than 0.001 part by weight, does not sufficiently help to improve mold releasability. The compound A, if in an amount of more than 5 parts by weight, impairs the adhesion to the substrate, and this causes inferior pattern accuracy, although the mold releasability is improved.

Exemplary photo-curable resins usable herein include cationically photo-curable resins; cationically photo-curable and free-radically photo-curable resins; and combinations of these resins.

Exemplary monomers usable in a cationic curing system (cationically curable monomers) include epoxy compounds, vinyl ether compounds, oxetane compounds, carbonate compounds, and dithiocarbonate compounds.

There are known many cationically photo-polymerizable functional groups, of which epoxy groups, vinyl groups, and oxetanyl groups, for example, are highly practical and widely used.

Examples of compounds having an epoxy group (epoxy compounds) include alicyclic epoxy resins such as CELLOXIDE 2000, CELLOXIDE 2021, CELLOXIDE 3000, and EHPE 3150CE each available from Daicel Chemical Industries, Ltd.; EPOMIK VG-3101 available from Mitsui Petrochemical Industries, Ltd. (now part of Mitsui Chemicals Inc.); E-1031S available from Yuka Shell Epoxy Kabushiki Kaisha (now part of Mitsubishi Chemical Corporation)); TETRAD-X and TETRAD-C each available from Mitsubishi Gas Chemical Company, Inc.; and EPB-13 and EPB-27 each available from Nippon Soda Co., Ltd. Examples of such epoxy compounds further include hybrid compounds having both an epoxy group and a (meth)acrylic group, such as 3,4-epoxycyclohexylmethyl (meth)acrylates, glycidyl methacrylate, and vinyl glycidyl ether. Each of these compounds can be used alone or in combination.

The vinyl-containing compounds (such as vinyl ether compounds) are not especially limited, as long as being compounds having a vinyl group. Commercially available products of such vinyl-containing compounds include 2-hydroxyethyl vinyl ether (HEVE), diethylene glycol monovinyl ether (DEGV), 2-hydroxybutyl vinyl ether (HBVE), and triethylene glycol divinyl ether each available from Maruzen Petrochemical Co., Ltd.; and RAPI-CURE Series, V-PYROL® (N-viny-2-pyrrolidone) and V-CAP™ (N-vinyl-2-caprolactam) each available from ISP Inc. Examples of such vinyl-containing compounds further include vinyl compounds having a substituent (e.g., alkyl or allyl) at the alpha and/or beta position; and vinyl ether compounds having an epoxy group and/or an oxetane group. Each of these compounds can be used alone or in combination.

The oxetanyl-containing compounds (oxetane compounds) are not especially limited, as long as being compounds having an oxetanyl group. Exemplary commercially available products thereof include 3-ethyl-3-(phenoxymethyl)oxetane (PDX), di[1-ethyl(3-oxetanyl)]methyl ether (DOX), 3-ethyl-3-(2-ethylhexyloxymethyl)oxetane (EHOX), 3-ethyl-3-{[3-(triethoxysilyl)propoxy]methyl}oxetane (TESOX), oxetanylsilsesquioxane (OX-SQ), and phenol-novolak oxetane (PNOX-1009) each available from Toagosei Co., Ltd. Examples of the oxetanyl-containing compounds further include hybrid compounds having both an oxetanyl group and a (meth)acrylic group. Each of these oxetane compounds may be used alone or in combination.

The carbonate compounds and dithiocarbonate compounds are not especially limited, as long as being compounds having a carbonate group or dithiocarbonate group in the molecule.

In an embodiment, the photocurable resin composition according to the present invention further contains, as a component, a compound that is expandable upon setting (setting-expandable compound). The resulting photocurable resin composition gives patterns with further excellent shapes, in which shrinkage on curing is further controlled.

Specifically, exemplary setting-expandable compounds include following Compounds 1 and 2.

(Compound 1)

Compound 1 is an epoxy compound having a bicyclo ring represented by following General Formula (1):

[Chemical Formula 1]

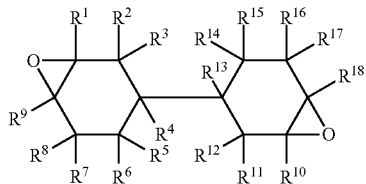

(1)

wherein $R^1$ to $R^{18}$ are the same as or different from one another and each represent hydrogen atom, a halogen atom, an alkyl group which may contain an oxygen atom or a halogen atom, or a substituted or unsubstituted alkoxy group.

(Compound 2)

Compound 2 is a carbonate compound represented by following General Formula (2):

[Chemical Formula 2]

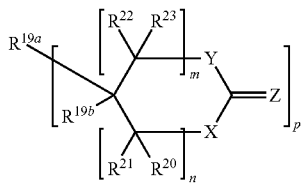

(2)

wherein $R^{19a}$ is the same as or different from one another and each represent hydrogen atom, a monovalent or multivalent hydrocarbon group having 1 to 10 carbon atoms, a monovalent or multivalent alkyl ester, or a monovalent or multivalent alkyl ether; $R^{19b}$s each represent hydrogen atom or an alkyl group; $R^{20}$ to $R^{23}$ are the same as or different from one another and each represent hydrogen atom, a halogen atom, an alkyl group, or an alkoxy group; "p" denotes an integer of 1 to 6; "m" and "n" each denotes an integer of 0 to 3; X, Y, and Z each represent oxygen atom or sulfur atom, wherein when "p" is 1, $R^{19a}$ represents hydrogen atom, or a monovalent alkyl group, monovalent alkyl ester, or monovalent alkyl ether each having 1 to 10 carbon atoms; and when "p" is 2 or more, $R^{19a}$ represents a single bond, a hydrocarbon group having a valency of "p", an alkyl group having a valency of "p", or an alkoxy group having a valency of "p".

The compounds (setting-expandable compounds) preferably have a structure including any of the cationically photopolymerizable functional groups. The coexistence of the compound having both reactivity and expandability in the system gives an ideal curable composition for nanoimprint, whose shrinkage on curing is controlled, and which does not undergo volumetric shrinkage on curing.

Exemplary monomers as free-radically curable monomers usable in a free-radical curing system (free-radical polymerization system) include (meth)acrylic esters, styrenic compounds, acrylic silane compounds, and multifunctional monomers.

Exemplary (meth)acrylic esters include alkyl (meth)acrylates such as methyl (meth)acrylates, ethyl (meth)acrylates, propyl (meth)acrylates, butyl (meth)acrylates, pentyl (meth)acrylates, and hexyl (meth)acrylates; hydroxyl-containing (meth)acrylic esters such as 2-hydroxyethyl (meth)acrylates, hydroxypropyl (meth)acrylates, hydroxybutyl (meth)acrylates, and caprolactone-modified 2-hydroxyethyl (meth)acrylates; and other (meth)acrylates such as methoxydiethylene glycol (meth)acrylates, ethoxydiethylene glycol (meth)acrylates, isooctyloxydiethylene glycol (meth)acrylates, phenoxytriethylene glycol (meth)acrylates, methoxytriethylene glycol (meth)acrylates, and methoxypolyethylene glycol (meth)acrylates. Exemplary styrenic compounds include styrene.

Exemplary acrylic silane compounds include γ-acryloxypropyltrimethoxysilane, γ-acryloxypropyltriethoxysilane, γ-acryloxypropylmethyldimethoxysilane, γ-acryloxypropylmethyldiethoxysilane, acryloxyethoxypropyltrimethoxysilane, acryloxyethoxypropyltriethoxysilane, acryloxydiethoxypropyltrimethoxysilane, and acryloxydiethoxypropyltriethoxysilane.

Exemplary multifunctional monomers include diethylene glycol diacrylate, triethylene glycol diacrylate, polyethylene glycol diacrylates, polyurethane diacrylates, trimethylolpropane triacrylate, pentaerythritol triacrylate, pentaerythritol tetraacrylate, triacrylate of ethylene-oxide-modified trimethylolpropane, triacrylate of propylene-oxide-modified trimethylolpropane, dipentaerythritol pentaacrylate, and dipentaerythritol hexaacrylate; methacrylates corresponding to these acrylates; and mono-, di-, tri-, or higher polyesters of a polybasic acid and a hydroxyalkyl (meth)acrylate. Each of these can be used alone or in combination.

Compounds each having both a free-radically polymerizable unsaturated group and at least one acid group are also preferred as free-radically curable monomers. Specifically, examples of such compounds include (meth)acrylic acids; vinylphenols; modified unsaturated monocarboxylic acids whose carboxylic acid moiety being bonded to an unsaturated group with the interposition of chain extension, including unsaturated monocarboxylic acids having an ester bond, such as β-carboxyethyl (meth)acrylates, 2-acryloyloxyethylsuccinic acid, 2-acryloyloxyethylphthalic acid, 2-acryloyloxyethylhexahydrophthalic acid, lactone-modified compounds and other unsaturated monocarboxylic acids having an ester bond, and modified unsaturated monocarboxylic acids having an ether bond; and compounds each having two or more carboxyl groups per molecule, such as maleic acid. Each of these compounds may be used alone or in combination. Among them, especially preferred are modified unsaturated monocarboxylic acids whose carboxylic acid moiety being bonded to an unsaturated group with the interposition of chain extension with lactone.

Specific examples of such compounds include Compounds 3 and 4 respectively represented by following Formulae (3) and (4):

Compound 3 is a lactone-modified (meth)acrylic acid and is represented by following General Formula (3):

[Chemical Formula 3]

(3)

$$CH_2=CCO[O(CR^{32}R^{33})_qCO]_sOH$$

wherein $R^{31}$ represents hydrogen atom or methyl group; $R^{32}$ and $R^{33}$ independently represent hydrogen atom, methyl group, or ethyl group; "q" denotes an integer of 4 to 8; and "s" denotes an integer of 1 to 10.

Compound 4 is a lactone-modified compound whose terminal hydroxyl group is modified with an acid anhydride and is represented by following General Formula (4):

[Chemical Formula 4]

(4)

wherein $R^{31}$, $R^{32}$, and $R^{33}$ are as defined above; $R^{34}$ represents, for example, a bivalent aliphatic saturated or unsaturated hydrocarbon group having 1 to 10 carbon atoms, a bivalent alicyclic saturated or unsaturated hydrocarbon group having 3 to 6 carbon atoms, p-xylene, or phenylene group; and "q" and "s" are as defined above. Specific examples thereof include β-carboxyethyl acrylate available from Daicel-Cytec Co., Ltd.; Aronix M5300 available from Toagosei Co., Ltd.; and PLACCEL FA Series available from Daicel Chemical Industries, Ltd.

The photocurable resin composition according to the present invention is usable in processing of such a thick film having a thickness exceeding about 50 μm. When the photocurable resin composition is used as a resist for fine structuring (fine patterning) adopted to uses where thick films are required, such as flat screens, holograms, waveguides, micromechanical components, and sensors, the photocurable resin composition can contain one or more binder resins (film-forming aids) as mentioned below as thickeners.

Exemplary binder resins usable in the photocurable resin composition according to the present invention include polymethacrylates or partially hydrolyzed products thereof; poly(vinyl acetate)s or hydrolyzed products thereof; poly(vinyl alcohol)s or partially acetalized products thereof; triacetylcellulose; polyisoprenes, polybutadienes, polychloroprenes, silicone rubbers; polystyrenes; poly(vinyl butyral)s; polychloroprenes; poly(vinyl chloride)s; polyarylates; chlorinated polyethylenes, chlorinated polypropylenes; poly-N-vinylcarbazoles or derivatives thereof; poly-N-vinylpyrrolidones or derivatives thereof; copolymers of styrene and maleic anhydride, or half-esters thereof; copolymers containing at least one polymerizable component selected from the group consisting of copolymerizable monomers such as acrylic acid, acrylic esters, methacrylic acid, methacrylic esters, acrylamide, acrylonitrile, ethylene, propylene, vinyl chloride, and vinyl acetate; and mixtures of them.

Exemplary binder resins usable herein further include curable resins of oligomer type, including unsaturated-group-containing epoxidized resins such as epoxidized polybutadienes and epoxidized butadiene styrene block copolymers. Examples of commercially available products thereof include EPOLEAD PB and ESBS each available from Daicel Chemical Industries, Ltd.

Copolymerized epoxy resins are also advantageous as binder resins. Examples thereof include copolymers of glycidyl methacrylate and styrene; copolymers of glycidyl methacrylate, styrene, and methyl methacrylate (e.g., CP-50M and CP-50S each available from NOF Corporation); and copolymers of glycidyl methacrylate and cyclohexylmaleimide.

Exemplary binder resins further include epoxidized resins having a unique structure, such as CELLTOP available from Daicel Chemical Industries, Ltd. as a copolymer of 3,4-epoxycyclohexylmethyl (meth)acrylate, styrene and methyl methacrylate, a copolymer of 3,4-epoxycyclohexyl (meth) acrylate and butyl acrylate, or a copolymer of 3,4-epoxycyclohexylmethyl (meth)acrylate and styrene.

Exemplary binder resins usable herein still further include novolak epoxy resins which are reaction products of a novolak with epichlorohydrin and/or methylepichlorohydrin, which novolak is prepared by reacting a phenol (e.g., phenol, cresol, a halogenated phenol, or an alkylphenol) with formaldehyde in the presence of an acidic catalyst. Exemplary commercially available products of such novolak epoxy resins include EOCN-103, EOCN-104S, EOCN-1020, EOCN-1027, EPPN-201, and BREN-S each available from Nippon Kayaku Co., Ltd.; DEN-431 and DEN-439 each available from The Dow Chemical Company; and N-73 and VH-4150 each available from DIC Corporation.

Exemplary binder resins usable herein further include bisphenol epoxy resins such as reaction products between epichlorohydrin and a bisphenol (e.g., bisphenol-A, bisphenol-F, bisphenol-S, or tetrabromobisphenol-A); and reaction products among diglycidyl ether of bisphenol-A, a condensate of the bisphenol, and epichlorohydrin. Exemplary commercially available products of such bisphenol epoxy resins include EPIKOTE (former name for jER) 1004 and EPIKOTE (former name for jER) 1002 each available from Yuka Shell Epoxy Kabushiki Kaisha (now part of Mitsubishi Chemical Corporation); and DER-330 and DER-337 each available from The Dow Chemical Company.

Exemplary binder resins usable herein further include reaction products typically of trisphenolmethane or triscresolmethane with epichlorohydrin and/or methylepichlorohydrin. Exemplary commercially available products thereof include EPPN-501 and EPPN-502 each available from Nippon Kayaku Co., Ltd. Examples of binder resins further include tris(2,3-epoxypropyl) isocyanurate and biphenyl diglycidyl ether. Each of these epoxy resins may be used alone or in combination.

The photocurable resin composition according to the present invention may further contain one or more radiation-sensitive initiators for cationic polymerization. Though not especially limited, as long as being known cationic polymerization initiators that generate an acid by the action of active energy rays, examples of the radiation-sensitive initiators for cationic polymerization include sulfonium salts, iodonium salts, phosphonium salts, and pyridinium salts.

Exemplary sulfonium salts include triphenylsulfonium hexafluorophosphate, triphenylsulfonium hexafluoroantimonate, bis(4-(diphenylsulfonio)phenyl)sulfide bis (hexafluorophosphate), bis(4-(diphenylsulfonio)phenyl)sulfide bis(hexafluoroantimonate), 4-di(p-toluoyl)sulfonio-4'-tert-butylphenylcarbonyl-diphenylsulfide hexafluoroantimonate, 7-di(p-toluoyl)sulfonio-2-isopropylthioxanthone hexafluorophosphate, and 7-di(p-toluoyl)sulfonio-2-isopropylthioxanthone hexafluoroantimonate; as well as aromatic sulfonium salts described typically in Japanese Unexamined Patent Application Publication (JP-A) No. H06 (1994)-184170, Japanese Unexamined Patent Application Publication (JP-A) No. H07 (1995)-61964, Japanese Unexamined Patent Application Publication (JP-A) No. H08 (1996)-165290, U.S. Pat. No. 4,231,951, and U.S. Pat. No. 4,256,828.

Exemplary iodonium salts include diphenyliodonium hexafluorophosphate, diphenyliodonium hexafluoroantimonate, and bis(dodecylphenyl)iodonium tetrakis(pentafluorophenyl)borate; as well as aromatic iodonium salts described typically in Japanese Unexamined Patent Application Publication (JP-A) No. H06 (1994)-184170 and U.S. Pat. No. 4,256,828.

Exemplary phosphonium salts include tetrafluorophosphonium hexafluorophosphate and tetrafluorophosphonium hexafluoroantimonate; as well as aromatic phosphonium salts described typically in Japanese Unexamined Patent Application Publication (JP-A) No. H06 (1994)-157624.

Exemplary pyridinium salts include pyridinium salts described typically in Japanese Patent No. 2519480 and Japanese Unexamined Patent Application Publication (JP-A) No. H05 (1993)-222112.

For further higher reactivity, an anion constituting the radiation-sensitive initiator for cationic polymerization is preferably $SbF_6^-$ or a borate (Compound 5) represented by following Formula (5):

[Chemical Formula 5]

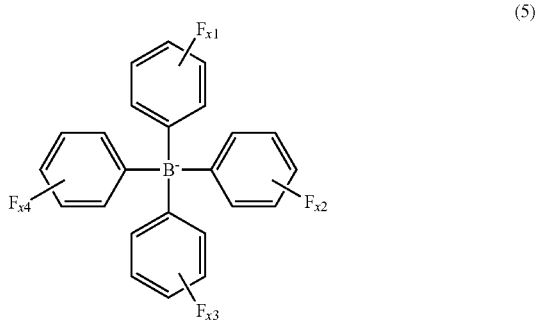

(5)

wherein each of X1, X2, X3, and X4 denotes an integer of 0 to 5, and the total of X1, X2, X3, and X4 is 1 or more. Of such borates, tetrakis(pentafluorophenyl)borate is more preferred.

The sulfonium salts and iodonium salts are also easily commercially available. Examples of such easily commercially available radiation-sensitive initiators for cationic polymerization include sulfonium salts such as UVI-6990 and UVI-6974 each available from Union Carbide Corporation (now part of The Dow Chemical Company), and ADEKA OPTOMER SP-170 and ADEKA OPTOMER SP-172 each available from ADEKA CORPORATION; and iodonium salts such as PI 2074 available from Rhodia.

Though not critical, the amount of radiation-sensitive initiators for cationic polymerization is preferably 0.1 to 15 parts by weight and more preferably 1 to 12 parts by weight, per 100 parts by weight of the cationically curable polymer.

The photocurable resin composition according to the present invention may further contain one or more radiation-sensitive initiators for free-radical polymerization. Exemplary radiation-sensitive initiators for free-radical polymerization include benzoin or benzoin alkyl ethers, such as benzoin, benzoin methyl ether, benzoin ethyl ether, and benzoin isopropyl ether; acetophenones such as acetophenone, 2,2-dimethoxy-2-phenylacetophenone, 2,2-diethoxy-2-phenylacetophenone, 1,1-dichloroacetophenone, 2-methyl-1-[4-(methylthio)phenyl]-2-morpholino-propan-1-one, and 2-benzyl-2-dimethylamino-1-(4-morpholinophenyl)-butan-1-one; anthraquinones such as 2-methylanthraquinone, 2-ethylanthraquinone, 2-tert-butylanthraquinone, 1-chloroanthraquinone, and 2-amylanthraquinone; thioxanthones such as 2,4-dimethylthioxanthone, 2,4-diethylthioxanthone, 2-chlorothioxanthone, and 2,4-isopropylthioxanthone; ketals such as acetophenone dimethyl ketal and benzil dimethyl ketal; benzophenones such as benzophenone; xanthones; 1,7-bis(9-acridinyl)heptane; and other known or common photoinitiators. Each of different photoinitiators can be used alone or in combination.

Each of these photoinitiators can be used in combination with one or more known or common photosensitizers. Exemplary photosensitizers include tertiary amines such as ethyl N,N-dimethylaminobenzoate, amyl N,N-dimethylaminobenzoate, pentyl 4-dimethylaminobenzoate, triethylamine, and triethanolamine.

Examples of commercially available initiators include Irgacure® 184 (1-hydroxycyclohexyl phenyl ketone), Irgacure® 500 (mixture of 1-hydroxycyclohexyl phenyl ketone and benzophenone), and other Irgacure® type photoinitiators each available from Ciba (now part of BASF); and Darocur® 1173, Darocur® 1116, Darocur® 1398, Darocur® 1174, and Darocur® 1020 each available from Merck. Exemplary thermal initiators suitable herein include organic peroxides in the form of diacyl peroxides, peroxydicarbonates, alkyl peresters, dialkyl peroxides, perketals, ketone peroxides, and alkyl hydroperoxides. Specific examples of such thermal initiators include dibenzoyl peroxide, t-butyl perbenzoate, and azobisisobutyronitrile.

The resin composition according to the present invention may further contain one or more sensitizers. Exemplary sensitizers usable herein include anthracenes, phenothiazenes, perylenes, thioxanthones, and benzophenone/thioxanthones. Exemplary sensitizers further include sensitizing dyes such as thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

Among them, especially preferred are anthracene sensitizers. Such an anthracene sensitizer, when used in combination with a cationic curing catalyst (radiation-sensitive initiator for cationic polymerization), helps the resin composition to have a dramatically improved sensitivity. In addition, the anthracene sensitizer has also a free-radical polymerization initiating function and thereby simplifies the catalyst species when used in a hybrid catalyst system, in which the hybrid catalyst system employs both a cationic curing system and a free-radical curing system in combination and is adopted in an embodiment of the present invention. Specifically, exemplary anthracene compounds effective herein include dibutoxyanthracene and dipropoxyanthraquinone (Anthracure® UVS-1331 and Anthracure® UVS-1221 each available from Kawasaki Kasei Chemicals Ltd.).

The amount of sensitizers to be used is 0.01 to 20 parts by weight and preferably 0.01 to 10 parts by weight, per 100 parts by weight of the curable monomer component.

The photocurable resin composition according to the present invention may further contain nanoscale particles (nanoparticles) according to necessity. The nanoscale particles for use herein can be polymerizable silanes such as a compound (Compound 6) represented by following Formula (6):

$$SiU_4 \qquad (6)$$

wherein the groups Us are the same as or different from one another and represent hydrolyzable groups or hydroxyl groups, and/or a compound (Compound 7) represented by following Formula (7):

$$R^{41}{}_a R^{42}{}_b SiU_{(4-a-b)} \qquad (7)$$

wherein $R^{41}$ represents a nonhydrolyzable group; $R^{42}$ represents a group containing a functional group; Us are as defined above; and "a" and "b" each denote a value of 0, 1, 2, or 3, and the total of "a" and "b" (a+b) is a value of 1, 2, or 3, and/or a condensate derived from such polymerizable silanes.

Exemplary nanoscale particles further include nanoscale particles selected from the group consisting of oxides, sulfides, selenides, tellurides, halides, carbides, arsenides, antimonides, nitrides, phosphides, carbonates, carboxylates, phosphates, sulfates, silicates, titanates, zirconates, aluminates, stannates, plumbates and mixed oxides of them.

The volume fraction (content) of nanoscale particles added according to necessity in the composition for nanoimprint is typically 0 to 50 percent by volume, preferably 0 to 30 percent by volume, and especially preferably 0 to 20 percent by volume, based on the total volume of the photocurable resin composition.

The nanoscale particles have particle diameters of generally about 1 to 200 nm, preferably about 2 to 50 nm, and especially preferably about 2 to 20 nm.

Nanoscale inorganic particles such as those known from PCT International Publication Number WO 96/31572 include, for example, oxides such as CaO, ZnO, CdO, $SiO_2$, $TiO_2$, $ZrO_2$, $CeO_2$, $SnO_2$, PbO, $Al_2O_3$, $In_2O_3$, and $La_2O_3$; sulfides such as CdS and ZnS; selenides such as GaSe, CdSe, and ZnSe; tellurides such as ZnTe and CdTe; halides such as NaCl, KCl, $BaCl_2$, AgCl, AgBr, AgI, CuCl, CuBr, $CdI_2$, and $PbI_2$; carbides such as $CeC_2$; arsenides such as AlAs, GaAs, and CeAs; antimonides such as InSb; nitrides such as BN, AlN, $Si_3N_4$, and $Ti_2N_4$; phosphides such as GaP, InP, $Zn_3P_2$, and $Cd_3P_2$; carbonates such as $Na_2CO_3$, $K_2CO_3$, $CaCO_3$, $SrCO_3$, and $BaCO_3$; carboxylates including acetates such as $CH_3COONa$ and $Pb(CH_3COO)_4$; phosphates; sulfates; silicates; titanates; zirconates; aluminates; stannates; plumbates; and corresponding mixed oxides whose composition preferably corresponds to the composition of common glasses having a low coefficient of thermal expansion, e.g. binary, ternary, or quaternary combinations of $SiO_2$, $TiO_2$, $ZrO_2$, and $Al_2O_3$.

These nanoscale particles can be prepared according to a known process, such as flame hydrolysis, flame pyrolysis, or plasma process according to the literatures described in PCT International Publication Number WO 96/31572. Among such nanoscale particles, especially preferred are stabilized colloidal, nanodisperse sols of inorganic particles, such as silica sols available from BAYER, $SnO_2$ sols available from Goldschmidt, $TiO_2$ sols available from Merck, $SiO_2$, $ZrO_2$, $Al_2O_3$, and $Sb_2O_3$ sols available from Nissan Chemicals, and aerosil dispersions available from DEGUSSA.

In a preferred embodiment, the photocurable resin composition for nanoimprint further contains a fluorosilane (Compound 8) represented by following Formula (8):

$$R^{43}(U^1)_3Si \quad (8)$$

wherein $R^{43}$ is an partially fluorinated or perfluorinated alkyl having 2 to 20 carbon atoms; and $U^1$ is an alkoxy having 1 to 3 carbon atoms, methyl, ethyl group, or chlorine.

Partially fluorinated alkyl is understood as meaning those alkyl groups in which at least one hydrogen atom is replaced by a fluorine atom.

Preferred examples of the group $R^{43}$ include $CF_3CH_2CH_2$, $C_2F_5CH_2CH_2$, $C_4F_9CH_2CH_2$, n-$C_6F_{13}CH_2CH_2$, n-$C_8F_{17}CH_2CH_2$, n-$C_{10}F_{21}CH_2CH_2$, and i-$C_3F_7O$—$(CH_2)_3$.

Examples of fluorosilanes of Formula (8), which are also commercially available, include tridecafluoro-1,1,2,2-tetrahydrooctyl-1-triethoxysilane, $CF_3CH_2CH_2SiCl_2CH_3$, $CF_3CH_2CH_2SiCl(CH_3)_2$, $CF_3CH_2CH_2Si$ $(CH_3)(OCH_3)_2$, i-$C_3F_7O$—$(CH_2)_3SiCl_2CH_3$, n-$C_6F_{23}CH_2CH_2SiCl_2CH_3$, and n-$C_6F_{23}CH_2CH_2SiCl$ $(CH_3)_2$.

The fluorosilanes of Formula (8) can be present in an amount of, for example, 0 to 3 percent by weight, preferably 0.05 to 3 percent by weight, more preferably 0.1 to 2.5 percent by weight, and especially preferably 0.2 to 2 percent by weight, based on the total weight of the resin composition for nanoimprint. The presence of fluorosilanes is desirable particularly when a glass or silica glass stamp is used as the transfer imprint stamp (nanostamper).

The present invention is further relates to a process for the production of a fine structure. This process includes the steps of:

(1) forming a film from the photocurable resin composition according to the present invention on a support;

(2) transferring a pattern to the film by means of a finely structured imprint stamp;

(3) curing the patterned film; and (4) removing the imprint stamp to give an imprinted fine structure.

The resulting fine structure is advantageously adopted to microlithography.

Exemplary materials for the support (substrate) on which an uncured film is formed from the composition in Step (1) include glass, silica glass, films, plastics, and silicon wafers.

In Step (1), the resin composition for nanoimprint according to the present invention is applied as a film preferably 0.01 to 1 μm thick by applying the resin composition to an adhesion-promoting film through a known procedure such as spin coating, slit coating, spray coating, or roller coating. The resin composition for nanoimprint according to the present invention has a viscosity of preferably 1 mPa·s to 10 Pa·s, more preferably 5 mPa·s to 5 Pa·s, and especially preferably 5 mPa·s to 1000 mPa·s.

The resin composition for nanoimprint can be applied either as such or as a solution in an organic solvent (organic vehicle). The organic solvent for use in the composition herein is used for the following purpose. When the composition is diluted with the solvent to form a paste, the paste can be easily applied (enables an easy coating process), the applied composition is dried to form a film, and the film can undergo contact exposure. Specifically, exemplary solvents include ketones such as methyl ethyl ketone and cyclohexanone; aromatic hydrocarbons such as toluene, xylenes, and tetramethylbenzene; glycol ethers such as Cellosolve (ethylene glycol monoethyl ether), methyl Cellosolve (ethylene glycol monomethyl ether), Carbitol (diethylene glycol monoethyl ether), methyl Carbitol (diethylene glycol monomethyl ether), butyl Carbitol (diethylene glycol monobutyl ether), propylene glycol monomethyl ether, dipropylene glycol monomethyl ether, dipropylene glycol monoethyl ether, and triethylene glycol monoethyl ether; acetates such as ethyl acetate, butyl acetate, Cellosolve acetate (ethylene glycol monoethyl ether acetate), butyl Cellosolve acetate (ethylene glycol monobutyl ether acetate), Carbitol acetate (diethylene glycol monoethyl ether acetate), butyl Carbitol acetate (diethylene glycol monobutyl ether acetate), and propylene glycol monomethyl ether acetate; alcohols such as ethanol, propanol, ethylene glycol, and propylene glycol; aliphatic hydrocarbons such as octane and decane; and petroleum solvents such as petroleum ethers, petroleum naphthas, hydrogenated petroleum naphthas, and solvent naphthas. Each of these solvents can be used alone or in combination.

Exemplary materials for the transfer imprint stamp (nanostamper) include transparent Teflon® resins, silicone rubbers, and cycloolefin polymers.

After the transfer stamp is placed on the coated film, the stamp is pressed against the coated film at a pressure of 0.1 to 100 MPa for a duration of typically 10 to 300 seconds, preferably 20 to 100 seconds, and especially preferably 30 to 60 seconds. The layer thickness of transferred material (film) is typically 50 to 1000 nm and preferably 150 to 500 nm.

While the transfer imprint stamp rests on the coated film, UV curing (curing by UV radiation) takes place. Heating can be performed in combination with the UV irradiation according to necessity. Typically, the film is heated at about 80° C. to 150° C. for about 1 to 10 minutes and thereafter irradiated with ultraviolet rays for about 0.1 second to 2 minutes to cure the film material, and the transfer imprint stamp is removed to give an imprinted fine structure.

An investigation of this finely structured article with the aid of a scanning electron microscope shows that not only the imprinted fine structure forms on the target substrate but also an unstructured residual layer of the film having a thickness of less than 30 nm.

For subsequent use in microelectronics, it is necessary to remove the residual layer in order to achieve a steep wall slope and a high aspect ratio.

Thus, the composition for nanoimprint according to the present invention can be etched with oxygen plasma or a $CHF_3/O_2$ gas mixture.

When the support is a semiconductor material to be structured, an effective process for the production of a finely structured semiconductor material further includes, in addition to Steps (1) to (4), the step of doping the semiconductor material in the etched areas, or etching the semiconductor material.

After the etching process, the resist coating (resist film) can be removed with a common solvent such as tetramethylammonium hydroxide.

Cationically curable monomers have advantages of (i) shrinking little on curing and (ii) being not inhibited with oxygen; but have disadvantages typically of (i) having low reaction rates and (ii) being largely affected typically by alkalis (bases). In contrast, free-radically curable monomers have advantages typically of (i) being highly stable during storage, (ii) having high polymerization rates, (iii) being less affected typically by water (moisture), (iv) being capable of giving thick films through curing, and (v) having large variation in monomer type; but have disadvantages typically of (i) shrinking largely on curing, (ii) suffering from inhibition with oxygen, and (iii) showing significant odor and causing skin irritation.

A composition according to an embodiment of the present invention corresponds to a cationically curable composition containing a curable monomer component, except for further containing the compound having a reactive functional group and a hydrophobic functional group in the same molecular skeleton in an amount of 0.001 to 5 parts by weight per 100 parts by weight of the total amount of the curable monomer component and binder resin (added according to necessity). The composition and a cured article therefrom excel all in coatability, adhesion to a glass substrate, releasability from an adherend plate (mold releasability), resistance to shrinkage on curing, and pattern shape.

A composition according to another embodiment of the present invention corresponds to a free-radically curable composition containing a monomer having a free-radically polymerizable unsaturated bond, except for further containing the compound having a reactive functional group and a hydrophobic functional group in the same molecular skeleton in an amount of 0.001 to 5 parts by weight per 100 parts by weight of the total amount of the curable monomer component and binder resin. The composition and a cured article therefrom excel all in coatability, adhesion to a glass substrate, releasability from an adherend plate, and pattern shape and have satisfactory resistance to shrinkage on curing, in which the shrinkage on curing, a defect of the free-radical curing system, is suppressed.

A composition according to yet another embodiment of the present invention corresponds to a composition containing both a cationically curable monomer and a free-radically curable monomer, except for further containing the compound having a reactive functional group and a hydrophobic functional group in the same molecular skeleton in an amount of 0.001 to 5 parts by weight per 100 parts by weight of the total amount of the curable monomer component and binder resin. The composition and a cured article therefrom excel all in coatability, adhesion to a glass substrate, releasability from an adherend plate, resistance to shrinkage on curing, and pattern shape and excel in releasability from a mold.

A hybrid curing system containing both a cationically curable monomer and a free-radically curable monomer and thus employing both a cationic curing system and a free-radical curing system in combination is a curing system which is in good balance between curing rate and shrinkage on curing. A composition according to still another embodiment of the present invention corresponds to a composition employing this hybrid system, except for further containing the compound having a reactive functional group and a hydrophobic functional group in the same molecular skeleton in an amount of 0.001 to 5 parts by weight per 100 parts by weight of the total amount of the curable monomer component and binder resin. The composition and a cured article therefrom can give a rectangular-profile pattern with a high resolution, in which shrinkage on curing is controlled and suppressed, and they excel in coatability, adhesion to a glass substrate, releasability from an adherend plate, and resistance to shrinkage on curing and have satisfactory releasability from a mold.

EXAMPLES

The present invention will be illustrated in further detail with reference to several working examples below. It should be noted, however, that these examples are never construed to limit the scope of the present invention.

Examples 1 to 11, Comparative Examples 1 to 3

1) Preparation Method of Coated Films

<Silicon Substrate>

A silicon substrate used herein was a 4-inch silicon wafer which had been preliminarily treated with hexamethyldisilazane.

<Photocurable Resin Compositions for Nanoimprint>

A series of photocurable resin compositions for nanoimprint was prepared according to a known procedure in a spin coater using a compound (A) having a reactive functional group and a hydrophobic functional group in the same molecular skeleton, a curable monomer component (B), an initiator (C), a sensitizer (D), nanoscale particles (E), a binder resin (film-forming aid; F), and a solvent (G) as given in Table 1. Specific compounds as the respective components in Table 1 are shown below.

Compounds having a reactive functional group and a hydrophobic functional group in the same molecular skeleton: shown in Table 2.

Curable monomer components: shown in Table 3.

Initiators

C-1: 4-Methylphenyl[4-(1-methylethyl)phenyliodonium tetrakis(pentafluorophenyl)borate; PI2074 supplied by Rhodia; radiation-sensitive initiator for cationic polymerization C-2: 2,2-Dimethoxy-1,2-diphenylethan-1-one; Irgacure 651 supplied by Ciba Japan (now part of BASF Japan Ltd.); radiation-sensitive free-radical polymerization initiator Sensitizers D-1: Dibutoxyanthracene; DBA; Anthracure® UVS-1331 supplied by Kawasaki Kasei Chemicals Ltd.

Nanoparticles

E-1: Fluorosilane; $R^{43}$ $(U^{1)})_3Si$ (Compound 8)

Binder Resins

F-1: 1:1 Copolymer of 3,4-epoxycyclohexyl methacrylate and butyl acrylate (A400 copolymer; CB1100) solvent G-1: Propylene glycol monomethyl ether acetate; MMP-GAC supplied by Daicel Chemical Industries, Ltd.

<Preparation of Coated Films>

Coated films were formed on the silicon wafer respectively from the compositions for nanoimprint through spin coating (at 3000 revolutions for 30 seconds). In the case of a composition containing a solvent, the coated film was dried at about 95° C. for 5 minutes to remove the solvent. The dried coated films each had a layer thickness of about 500 nm.

2) Transfer and Imprinting of Fine Structure onto Target Substrate

A fine structure pattern was transferred and imprinted onto the target substrate with an imprinter (Model NM-0401 supplied by Meisho Kiko Co.). This imprinter is a computer-controlled test machine which makes it possible to program, for example, loading and relief speeds and heating temperature and to thereby maintain defined pressures over a predetermined time. With an attached high-pressure mercury lamp, the imprinter performs UV irradiation to start curing photochemically. In Examples 1 to 11 and Comparative Examples 1 to 3, the transfer and imprinting was performed on the above-prepared coated films at the pressing pressures and pressing temperatures for pressing times, and at UV exposures, respectively given in Table 1. Specifically, 200-nm line-and-space patterns were transferred in Examples 1 to 11 and Comparative Example 1 to 3.

The above-formed patterns (traces) to constitute nanostructures with a wall slope of about 90 degrees were evaluated on shape by observing how the both ends of the traces were and whether the pattern edges remained rectangular. The residual film was then etched using oxygen plasma and etched with a 25:10 (by volume) gas mixture of $CHF_3$ and $O_2$ to give patterns (to finely pattern) on the silicon wafer.

<Evaluations of Fine Patterning>

The fine patterning using the resin compositions according to Examples 1 to 11 and Comparative Examples 1 to 3 was evaluated on coatability, shrinkage on curing, and shape of fine structure pattern according to the following methods. The results are shown in Table 1.

(Coatability)

A sample curable composition was applied to the silicon wafer through spin coating, and the surface of a coated film was observed to determine whether or not a uniform coated film was formed. The coatability was evaluated according to the following criteria, and the results are shown in Table 1.

A: Uniform coated film was obtained.

C: Crawling of the coated film after spin coating was observed.

(Shrinkage on Curing)

The appearance of the pattern (traces) which was formed after the transfer imprint stamp was removed was observed with a scanning electron microscope. The shrinkage on curing was evaluated according to the following criteria, and the results are shown in Table 1.

AA: Pattern edges and pattern ends remained rectangular.

A: Pattern edges and pattern ends were somewhat curved or rounded.

B: Pattern edges and pattern ends were curved or rounded.

C: Pattern surface at both ends shrank to cause peeling.

(Production of Fine Structure Patterns)

After residual portions of the transferred pattern were removed by etching with oxygen plasma, the pattern was further dry-etched with a 25:10 (by volume) gas mixture of $CHF_2$ and $O_2$, and the shape of the resulting pattern on the silicon wafer was observed with a scanning electron microscope. The pattern shape was evaluated according to the following criteria, and the results are shown in Table 1.

A: Pattern edges remained rectangular.

C: Pattern edges did not remain rectangular.

<Evaluation of Releasability from Transfer Imprint Stamp>

The resin compositions according to Examples 1 to 11 and Comparative Examples 1 to 3 were evaluated on releasability from the transfer imprint stamp in the following manner. The results are shown in Table 1.

An aliquot (0.005 g to 0.01 g) of a sample curable composition was dropped onto a center part of a glass plate (hereinafter referred to as "glass substrate") 26 mm wide and 76 mm long. After prebaking at 90° C. for 5 minutes in the case of a curable composition containing a solvent to remove the solvent, the applied curable composition on the glass substrate was brought into intimate contact with another glass substrate independently prepared (hereinafter referred to as the "adherend plate") 26 mm wide and 76 mm long so that the two glass substrates crossed each other at right angles. The two glass substrates were pressed against each other until the curable composition uniformly spread in the crossed portion, and while maintaining this state, the curable composition was cured by being irradiated with ultraviolet rays. Next, the two glass substrates were peeled off, and the peel strengths thereof were measured.

The peel tests were performed by using two types of adherend plates, i.e., an adherend plate which had not been treated on its surface and an adherend plate which had been treated on its surface with a release agent (mold release). The adhesion of a sample to the glass substrate was evaluated based on a peel strength as measured by using the adherend plate without surface treatment. The mold releasability (good or poor) was evaluated based on a peel strength as measured by using the adherend plate whose surface had been treated with a release agent.

The release treatment of the adherend plate surface was performed by immersing the adherend plate in a fluorine surface treating agent DURASURF HD-1100 (supplied by Daikin Industries Ltd.) as a release agent, removing a solvent through air drying, fixing the release agent through leaving at room temperature for 24 hours, and washing the adherend plate with a fluorocarbon to remove excess release agent.

The adhesion to the glass substrate was evaluated based on the peel strength according to the following criteria:

A: Peel strength was equal to or more than 15 N

C: Peel strength was less than 15 N

The releasability from the releasably treated adherend plate was evaluated based on the peel strength according to the following criteria:

A: Peel strength was less than 10 N

C: Peel strength was equal to or more than 10 N

The results of the above evaluations are shown in Table 1.

Table 1 demonstrates that the photocurable resin compositions according to the present invention excel in mold releasability.

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Com. Ex. 1 | Com. Ex. 2 | Com. Ex. 3 |
|---|---|---|---|---|---|---|---|---|---|---|---|---|---|---|---|
| Curable resin composition | | | | | | | | | | | | | | | |
| Compound having both reactive functional group and hydrophobic functional group in the same molecular skeleton | A-1 | 0.5 | 0.5 | 0.5 | 0.5 | | | | | 0.1 | | | 0.0008 | | |
| | A-2 | | | | | 0.5 | | | | | 2 | 0.5 | | 6 | |
| | A-3 | | | | | | 0.5 | | | | | | | | |
| | A-4 | | | | | | | 0.5 | | | | | | | |
| | A-5 | | | | | | | | 0.5 | | | | | | |
| Curable monomer | B-1 | 20 | 10 | | | 10 | 10 | 10 | 10 | | 20 | | | 20 | 20 |
| | B-2 | 30 | 40 | | | 40 | 40 | 40 | 40 | | 30 | | | 30 | 30 |
| | B-3 | 50 | | | | | | | | | 50 | | | 50 | 50 |
| | B-4 | | 10 | 10 | | 10 | 10 | 10 | 10 | 10 | | | 10 | | |
| | B-5 | | 20 | 40 | | 20 | 20 | 20 | 20 | 40 | | | 40 | | |
| | B-6 | | | | 70 | | | | | | | 70 | | | |
| Initiator | C-1 | 1 | 1 | | 1 | 1 | 1 | 1 | 1 | | 1 | 1 | | 1 | 1 |
| | C-2 | | 3 | 5 | | 3 | 3 | 3 | 3 | 5 | | | 5 | | |
| Sensitizer | D-1 | 0.5 | 0.5 | | 0.5 | 0.5 | 0.5 | 0.5 | 0.5 | | 0.5 | 0.5 | | 0.5 | 0.5 |
| Nanoparticles | E-1 | | | | | | | | | | | 3 | | | |
| Film-forming aid | F-1 | | 20 | 50 | 30 | 20 | 20 | 20 | 20 | 50 | | 30 | 50 | | |
| Solvent | G-1 | | | 400 | | | | | | 400 | | 400 | | | |
| Pressing pressure | MPa | 1.0 | 1.0 | 1.0 | 1.0 | 1.0 | 1.0 | 1.0 | 1.0 | 1.0 | 1.0 | 1.0 | 1.0 | 1.0 | 1.0 |
| Pressing temperature | °C. | 25 | 25 | 25 | 25 | 25 | 25 | 25 | 25 | 25 | 25 | 25 | 25 | 25 | 25 |
| Pressing time | sec. | 60 | 60 | 60 | 60 | 60 | 60 | 60 | 60 | 60 | 60 | 60 | 60 | 60 | 60 |
| UV exposure | J/cm$^2$ | 1 | 1 | 1 | 1 | 1 | 1 | 1 | 1 | 1 | 1 | 1 | 2 | 2 | 1 |
| Evaluation results | | | | | | | | | | | | | | | |
| (1) Coatability | | A | A | A | A | A | A | A | A | A | A | A | A | A | A |
| (2) Adhesion to glass substrate | | A | A | A | A | A | A | A | A | A | A | A | C | C | A |
| (3) Releasability from adherend plate | | A | A | A | A | A | A | A | A | A | A | A | C | A | C |
| (4) Shrinkage on curing | | AA | AA | A | A | AA | AA | AA | AA | A | AA | A | B | AA | AA |
| (5) Pattern shape | | A | A | A | A | A | A | A | A | A | A | A | C | C | C |

The amounts of the respective components in the curable resin compositions in Table 1 are indicated by part(s) by weight.

TABLE 2

Compounds having both a reactive functional group and a hydrophobic functional group in the same molecular skeleton

| | Supplier | Reactive functional group | Hydrophobic functional group | Material name |
|---|---|---|---|---|
| A-1 PolyFox PF320 | Omnova Solutions, Inc. | Vinyl group | Fluorine group | Note 1) |
| A-2 Surfynol 485 | Nisshin Chemical Industry Co., Ltd. | Hydroxyl group | Aliphatic functional group | Ethylene oxide adduct of 2,4,7,9-tetramethyl-5-denecy-4,7-diol |
| A-3 FZ-3720 | Dow Corning Toray Co., Ltd. | Epoxy group | Alkoxysilane group | Dimethyl, methylepoxyalkyl siloxane |
| A-4 FS 1265 10,000 CS | Dow Corning Toray Co., Ltd. | Trimethyl group | Alkylsilane group, trifuluoropropylmethyl group | Trimethyl-terminated trifluoropropylmethylsiloxane |
| A-5 PCLAOE | Daicel Chemical Industries, Ltd. | Epoxy group | Long-chain alkyl group | Note 2) |

Note 1):
[Chemical Formula 6]

[Chemical Formula 6]

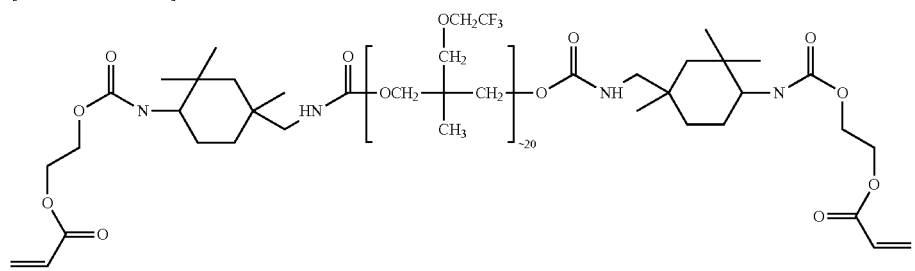

TABLE 2-continued

Compounds having both a reactive functional group and a hydrophobic functional group in the same molecular skeleton

| Supplier | Reactive functional group | Hydrophobic functional group | Material name |
|---|---|---|---|

Note 2):
[Chemical Formula 7]

[Chemical Formula 7]

$$R-CH_2CH-CH_2 \atop \diagdown O \diagup$$

R: $C_{12}$~$C_{14}$ or $C_{16}$~$C_{18}$

TABLE 3

Curable monomers

| | Supplier | | Material name |
|---|---|---|---|
| B-1 | CELLOXIDE 2021P | Daicel Chemical Industries, Ltd. | Cationically curable: epoxy compound | 3,4-Cyclohexylmethyl 3,4-cyclohexanecarboxylate |
| B-2 | CELLOXIDE 8000 | Daicel Chemical Industries, Ltd. | Cationically curable: epoxy compound | Bicyclohexyl-3,3-diene dioxide |
| B-3 | ARON OXETANE OXT-121 | Toagosei Co. Ltd. | Cationically curable: oxetane compound | 1,4-Bis[(3-ethyl-3-oxetanylmethoxy)methyl]benzene n = 1 |
| B-4 | ARONIX M-309 | Toagosei Co. Ltd. | Free-radically curable: acrylic compound | TMPTA: Trimethyrolpropane triacrylate |
| B-5 | LIGHT-ACRYLATE 4EO-A | Kyoeisha Chemical Co., Ltd. | Free-radically curable: acrylic compound | $CH_2$=CHCOO—$(CH_2CH_2O)$n—COCH=$CH_2$ |
| B-6 | TEGDVE | Maruzen Petrochemical Co., Ltd. | Cationically curable: vinyl ether compound | Triethylene glycol divinyl ether |

According to Example 1, a resin composition for nanoimprint as a cationically curable composition, and a cured article from the composition were prepared by adding, to 100 parts by weight of a cationically curable monomer component, 0.5 part by weight of a compound having a vinyl group as the reactive functional group and a fluorine group as the hydrophobic functional group in the same molecular skeleton, in which the cationically curable monomer component included 50 parts by weight of epoxy compounds and 50 parts by weight of an oxetane compound. According to Example 10, a resin composition for nanoimprint as a cationically curable composition, and a cured article from the composition were prepared by adding, to 100 parts by weight of a cationically curable monomer component, 2 parts by weight of a compound having a hydroxyl group as the reactive functional group and an aliphatic functional group as the hydrophobic functional group in the same molecular skeleton, in which the cationically curable monomer component included 50 parts by weight of epoxy compounds and 50 parts by weight of an oxetane compound. The prepared compositions showed satisfactory coatability and gave uniform coated films respectively.

The prepared compositions were respectively applied to the adherend plate without surface treatment, and applied films were cured. The cured films showed peel strengths of 15 N or more, demonstrating satisfactory adhesion to the glass substrate. Independently, the compositions were respectively applied to the adherend plate treated on its surface with a release agent, and applied films were cured. The cured films showed peel strengths of less than 10 N, demonstrating that they excelled also in releasability from the adherend plate (mold releasability).

Independently, the compositions were respectively applied to the silicon wafer through spin coating to give coated films, the coated films were cured, and the transfer imprint stamp was removed to give patterns. In the patterns, pattern edges and pattern ends remained rectangular, demonstrating that the compositions had also excellent resistance to shrinkage on curing.

After residual portions of the patterns were removed by etching with oxygen plasma, the patterns were further dry-etched with a $CHF_3/O_2$ gas mixture. The resulting patterns on the silicon wafers had excellent shapes in which pattern edges remained rectangular.

In contrast, according to Comparative Example 2, a composition was prepared by the procedure of Example 10, except for adding 6 parts by weight of the compound to 100 parts by weight of the cationically curable monomer component. The compound as with Example 10 had a hydroxyl group as the reactive functional group and an aliphatic functional group as the hydrophobic functional group in the same molecular skeleton, and the cationically curable monomer component as with Example 10 included 50 parts by weight of epoxy compounds and 50 parts by weight of an oxetane compound. A cured article obtained from the prepared composition showed poor adhesion to the glass substrate and gave a pattern whose rectangular shape did not remain, although the composition was cured at a UV exposure 2 times that in Example 10.

According to Comparative Example 3, a resin composition for nanoimprint and a cured article therefrom were prepared by the procedure of Examples 1 and 10, except for not using the compound having a reactive functional group and a hydrophobic functional group in the same molecular skeleton. The resulting cured article had poor releasability from the adherend plate and gave a pattern whose rectangular shape did not remain.

According to Examples 2 and 5 to 8, resin compositions for nanoimprint each composed of both a cationically curable composition and a free-radically curable composition, and cured articles therefrom were prepared by adding, to 100 parts by weight of the total amount of curable monomer components (80 parts by weight) and a binder resin (20 parts by weight), 0.5 part by weight of a compound as given in Table 1, in which the compound had a reactive functional group and a hydrophobic functional group in the same molecular skeleton, and the curable monomer components included 50 parts by weight of epoxy compounds as cationically curable monomer components, and 30 parts by weight of acrylic compounds as monomers having a free-radically polymerizable unsaturated bond. All the prepared compositions showed satisfactory coatability and gave uniform coated films.

The prepared compositions were respectively applied to the adherend plate without surface treatment, and applied films were cured. The cured films showed peel strengths of 15 N or more and showed satisfactory adhesion to the glass substrate. Independently, the compositions were respectively applied to the adherend plate treated on its surface with a release agent, and applied films were cured. The cured films showed peel strengths of less than 10 N, demonstrating that they excelled also in releasability from the adherend plate.

After coated films from the compositions were cured, the transfer imprint stamp was removed. In the respective patterns thus formed pattern edges and pattern ends remained rectangular, demonstrating that the compositions had satisfactory resistance to shrinkage on curing.

After residual portions of the patterns were removed by etching with oxygen plasma, the patterns were further dry-etched with a $CHF_3/O_2$ gas mixture. The resulting patterns on the silicon wafers had excellent shapes in which pattern edges remained rectangular.

According to Example 3, a resin composition for nanoimprint as a free-radically curable composition, and a cured article therefrom were prepared by using 50 parts by weight of acrylic compounds as monomers having a free-radically polymerizable unsaturated bond, 50 parts by weight of a binder resin, and 400 parts by weight of a solvent and further using a compound in an amount of 0.5 part by weight per 100 parts by weight of the total amount of the curable monomers (50 parts by weight) and the binder resin (50 parts by weight), in which the compound had a vinyl group as the reactive functional group and a fluorine group as the hydrophobic functional group in the same molecular skeleton. The prepared composition showed satisfactory coatability and gave a uniform coated film.

The prepared composition was applied to the adherend plate without surface treatment to give a film, and the applied film was cured. The cured film had a peel strength of 15N or more, demonstrating that the cured film had excellent adhesion to the glass substrate even though the composition employed a free-radical curing system. Independently, the composition was applied to the adherend plate treated on its surface with a release agent, and the applied film was cured. The cured film had a peel strength of less than 10 N, demonstrating that the cured film excelled also in releasability from the adherend plate.

After the coated film from the composition was cured, the transfer imprint stamp was removed. In the resulting pattern, pattern edges and pattern ends were somewhat curved (rounded), but neither shrinkage nor peeling at both ends of the pattern surface was observed, demonstrating that the composition had good resistance to shrinkage on curing even through it employed a free-radical curing system.

After residual portions of the pattern were removed by etching with oxygen plasma, the pattern was further dry-etched with a $CHF_3/O_2$ gas mixture. The resulting pattern on the silicon wafer showed an excellent shape, in which pattern edges remained rectangular.

According to Example 9, a composition was prepared in the same manner as in Example 3, except for using 0.1 part by weight of the compound per 100 parts by weight of the total amount of the curable monomers (50 parts by weight) and the binder resin (50 parts by weight). Specifically, the composition contained 50 parts by weight of the acrylic compounds as monomers having a free-radically polymerizable unsaturated bond, 50 parts by weight of the binder resin, and 400 parts by weight of the solvent as in Example 3 and further containing the compound in an amount of 0.1 part by weight per 100 parts by weight of the total amount of the curable monomers (50 parts by weight) and the binder resin (50 parts by weight), in which the compound had a vinyl group as the reactive functional group and a fluorine group as the hydrophobic functional group in the same molecular skeleton. The prepared composition showed excellent coatability and gave a uniform coated film. The cured article from the composition excelled all in adhesion to the glass substrate, releasability from the adherend plate, and pattern shape and had good resistance to shrinkage on curing.

In contrast, according to Comparative Example 1, a composition was prepared in the same manner as in Examples 3 and 9, except for using 0.0008 part by weight of the compound per 100 parts by weight of the total amount of the curable monomers (50 parts by weight) and the binder resin (50 parts by weight). Specifically, the composition contained 50 parts by weight of the acrylic compounds as monomers having a free-radically polymerizable unsaturated bond, 50 parts by weight of the binder resin, and 400 parts by weight of the solvent as in Examples 3 and 9, and further contained the compound in an amount of 0.0008 part by weight per 100 parts by weight of the total amount of the curable monomers (50 parts by weight) and the binder resin (50 parts by weight), in which the compound had a vinyl group as the reactive functional group and a fluorine group as the hydrophobic functional group in the same molecular skeleton. The cured article from the composition was poor in both adhesion to the glass substrate and releasability from the adherend plate, and the formed pattern failed to maintain its rectangular shape.

According to Example 4, a composition was prepared by using 70 parts by weight of a vinyl ether compound as a cationically curable monomer and incorporating 0.5 part by weight of a compound per 100 parts by weight of the curable monomer (70 parts by weight) and a binder resin (30 parts by weight), in which the compound had a vinyl group as the reactive functional group and a fluorine group as the hydrophobic functional group in the same molecular skeleton. The prepared composition showed satisfactory coatability and gave a uniform coated film. The cured article from the composition excelled all in adhesion to the glass substrate, releasability from the adherend plate, and pattern shape and showed good resistance to shrinkage on curing.

According to Example 11, a composition was prepared, which contained 70 parts by weight of a vinyl ether compound as a cationically curable monomer and further contained 0.5 part by weight of a compound per 100 parts by weight of the total amount of the curable monomer (70 parts by weight) and a binder resin (30 parts by weight), in which the compound had a hydroxyl group as the reactive functional group and an aliphatic functional group as the hydrophobic functional group in the same molecular skeleton. The prepared composition showed satisfactory coatability and gave a uniform coated film. A cured article from the composition excelled all in adhesion to the glass substrate, releasability from the adherend plate, and pattern shape and showed good resistance to shrinkage on curing.

INDUSTRIAL APPLICABILITY

The photocurable resin compositions for nanoimprint according to the present invention enable more economical and more accurate production of fine structures typically for electronic components, which fine structures show small line edge roughness. The photocurable resin compositions are thereby very useful typically in semiconductor materials, flat screens, holograms, waveguides, structures for media, micromechanical components or sensors, and other micromechanical components.

The invention claimed is:

1. A photocurable resin composition for nanoimprint, comprising a curable monomer component with or without a binder resin, wherein the photocurable resin composition further comprises 0.001 to 5 parts by weight of a compound A per 100 parts by weight of the total amount of the curable monomer component and the binder resin, the compound A having both a reactive functional group and a hydrophobic functional group in the same molecular skeleton;
wherein the reactive functional group is at least one functional group selected from the group consisting of hydroxyl groups, epoxy groups, oxetanyl groups, alkoxysilane groups, and free-radically polymerizable vinyl groups; and
wherein the photocurable resin composition is a cationically curable composition, which cationically curable composition contains, as the compound A, a compound having a vinyl group as the reactive functional group and a fluorine-containing group as the hydrophobic functional group and contains, as the curable monomer component, at least one epoxy compound or oxetane compound.

2. The photocurable resin composition for nanoimprint, according to claim 1, wherein the hydrophobic functional group is at least one functional group selected from the group consisting of fluorine-containing groups, alkylsilane groups, alicyclic hydrocarbon groups, and aliphatic hydrocarbon groups having 4 or more carbon atoms.

3. The photocurable resin composition for nanoimprint, according to claim 1, wherein the cationically curable composition contains a cationically curable monomer component and/or a free-radically curable composition containing a monomer having a free-radically polymerizable unsaturated bond, and wherein the cationically curable monomer component is at least one compound selected from the group consisting of epoxy compounds, vinyl ether compounds, oxetane compounds, carbonate compounds, and dithiocarbonate compounds.

4. The photocurable resin composition for nanoimprint, according to claim 1, wherein the curable monomer component comprises an acrylic monomer.

5. A cured article, cured from the photocurable resin composition according to claim 1.

6. A process for the production of a fine structure, the process comprising the step of subjecting the photocurable resin composition according to claim 1 to nanoimprinting to give a fine structure.

7. The process for the production of a fine structure, according to claim 6, the process comprising the steps of:
(1) forming a film from the photocurable resin composition according to claim 1 on a support;
(2) transferring a pattern to the film by means of a finely structured imprint stamp;
(3) curing the patterned film; and
(4) removing the imprint stamp to give an imprinted fine structure.

8. A fine structure produced by the process according to claim 6.

9. The fine structure according to claim 8, as one selected from the group consisting of semiconductor materials, flat screens, holograms, waveguides, structures for media, micromechanical components, and sensors.

* * * * *

UNITED STATES PATENT AND TRADEMARK OFFICE
CERTIFICATE OF CORRECTION

PATENT NO.       : 8,530,539 B2                                                                 Page 1 of 1
APPLICATION NO. : 12/866398
DATED            : September 10, 2013
INVENTOR(S)      : Miyake et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 248 days.

Signed and Sealed this

Fifteenth Day of September, 2015

Michelle K. Lee
*Director of the United States Patent and Trademark Office*